United States Patent
Han et al.

(10) Patent No.: US 7,629,242 B2
(45) Date of Patent: Dec. 8, 2009

(54) METHOD FOR FABRICATING SEMICONDUCTOR DEVICE HAVING RECESS GATE

(75) Inventors: Ky-Hyun Han, Kyoungki-do (KR); Jung-Seock Lee, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 113 days.

(21) Appl. No.: 11/480,025

(22) Filed: Jun. 29, 2006

(65) Prior Publication Data

US 2007/0099384 A1    May 3, 2007

(30) Foreign Application Priority Data

Nov. 1, 2005    (KR)    .................. 10-2005-0103734

(51) Int. Cl.
    *H01L 21/3205*    (2006.01)
(52) U.S. Cl. ............... 438/589; 438/197; 257/E29.321
(58) Field of Classification Search ............... 438/197, 438/598; 257/328–330, E29.321, E21.384, 257/E21.419, E21.428
    See application file for complete search history.

(56) References Cited

U.S. PATENT DOCUMENTS

| 7,154,144 B2 * | 12/2006 | Kim et al. ............... 257/328 |
| 7,282,429 B2 * | 10/2007 | Lai et al. ............... 438/570 |
| 7,326,621 B2 * | 2/2008 | Cho et al. ............... 438/296 |
| 2006/0049455 A1 * | 3/2006 | Jang et al. ............... 257/330 |

FOREIGN PATENT DOCUMENTS

KR    10-2005-0011376 A    1/2005

OTHER PUBLICATIONS

Wolf et al., "Silicon Processing for the VLSI Era, vol. 1—Process Technology," 2nd Edition, 2000, p. 687-688 ISBN 0-9616721-6-1.*

* cited by examiner

*Primary Examiner*—Ha Tran T Nguyen
*Assistant Examiner*—Daniel Whalen
(74) *Attorney, Agent, or Firm*—Blakely Sokoloff Taylor & Zafman (57) ABSTRACT

A method for fabricating a semiconductor device having a recess gate includes forming a hard mask pattern on a substrate, etching the substrate using the hard mask pattern as an etch barrier to form a recess pattern, forming a passivation layer protecting surfaces of the recess pattern, etching a bottom surface of the recess pattern while protecting sidewalls of the recess pattern, performing an isotropic etching process onto a bottom portion of the recess pattern, and forming a gate pattern partially buried into the recess pattern after the isotropic etching process is performed.

18 Claims, 8 Drawing Sheets

50  D2

METHOD FOR FABRICATING SEMICONDUCTOR DEVICE HAVING RECESS GATE

FIELD OF THE INVENTION

The present invention relates to a method for fabricating a semiconductor device, and more particularly, to a method for fabricating a semiconductor device having a flask-shaped recess gate.

DESCRIPTION OF RELATED ARTS

As semiconductor devices become highly integrated, it is difficult to secure a refresh characteristic of a device during a typical forming process of a planar gate interconnection in which a gate is formed on a planarized active region. The difficulty is caused by a junction leakage generated from an increase of electric field as a gate channel length gradually reduces and a doping concentration of ion-implantation increases.

To improve such a shortcoming, a recess gate process is introduced as another method for forming a gate. In the recess gate process, a gate is formed after an active region is etched into a recess pattern. This recess gate process lengthens a channel length and lowers a doping concentration level of an ion-implantation when compared to the typical method for forming a planar gate. Consequently, a refresh characteristic of the device improves.

Figure 1A:
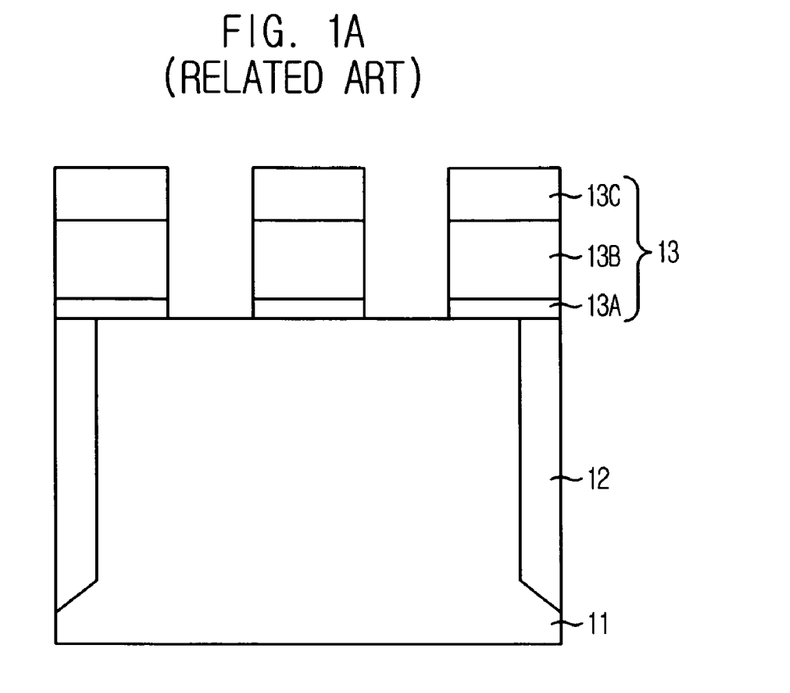
FIGS. 1A and 1B are cross-sectional views illustrating a typical method for fabricating a semiconductor device.
Figure 1B:
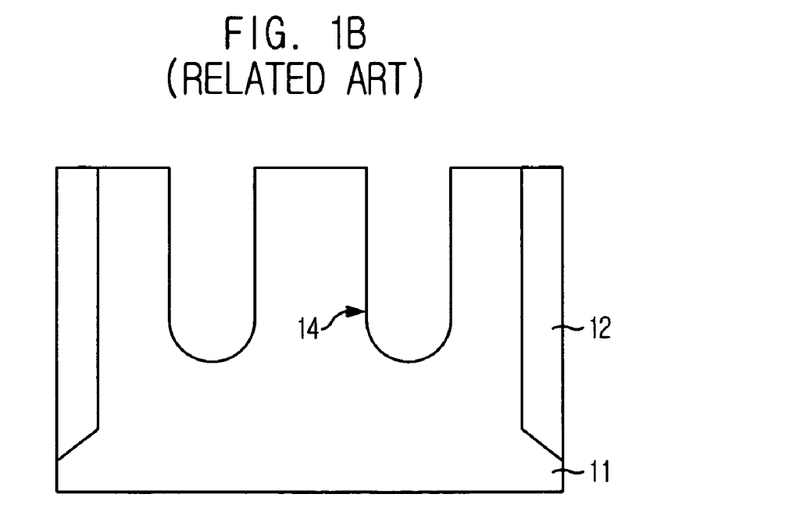

FIGS. 1A and 1B illustrate cross-sectional views of a semiconductor device to describe a typical method for fabricating the same.

Referring to FIG. 1A, device isolation regions 12 are formed in a substrate 11 to define an active region. Thereafter, a mask pattern 13 is formed over the device isolation regions 12 and the substrate 11. The mask pattern 13 is configured with a sacrificial oxide layer 13A, a hard mask 13B, and a photoresist layer 13C.

Referring to FIG. 1B, predetermined portions of the substrate 11 are etched at once using the mask pattern 13 as an etch mask, thereby forming recesses 14. The mask pattern 13 is removed when the recesses 14 are formed.

Figure 2A:
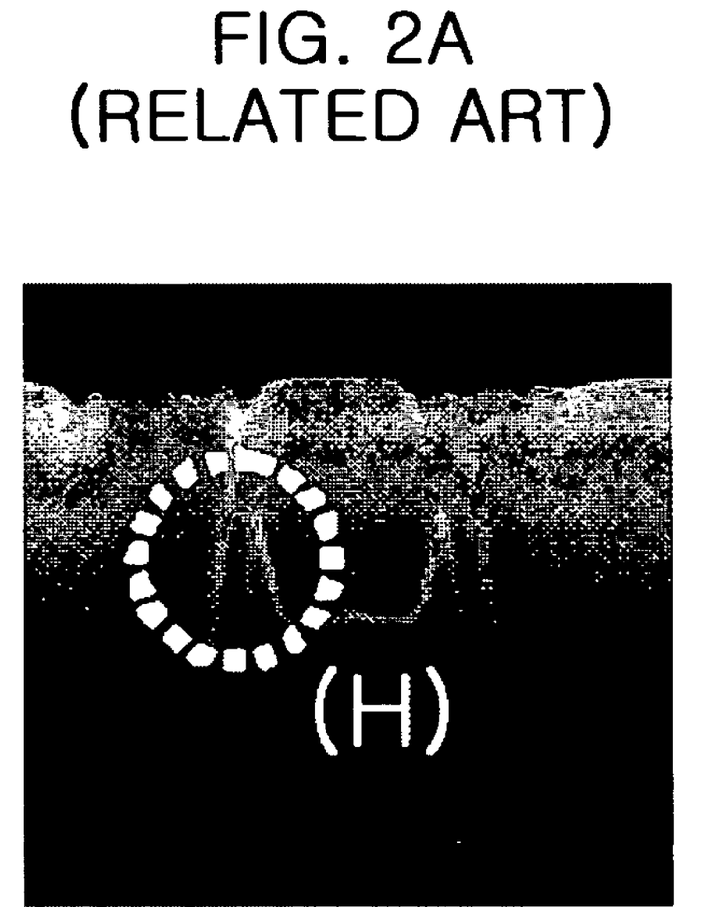
FIGS. 2A and 2B illustrate micrographic views of a semiconductor device fabricated by the typical method.
Figure 2B:
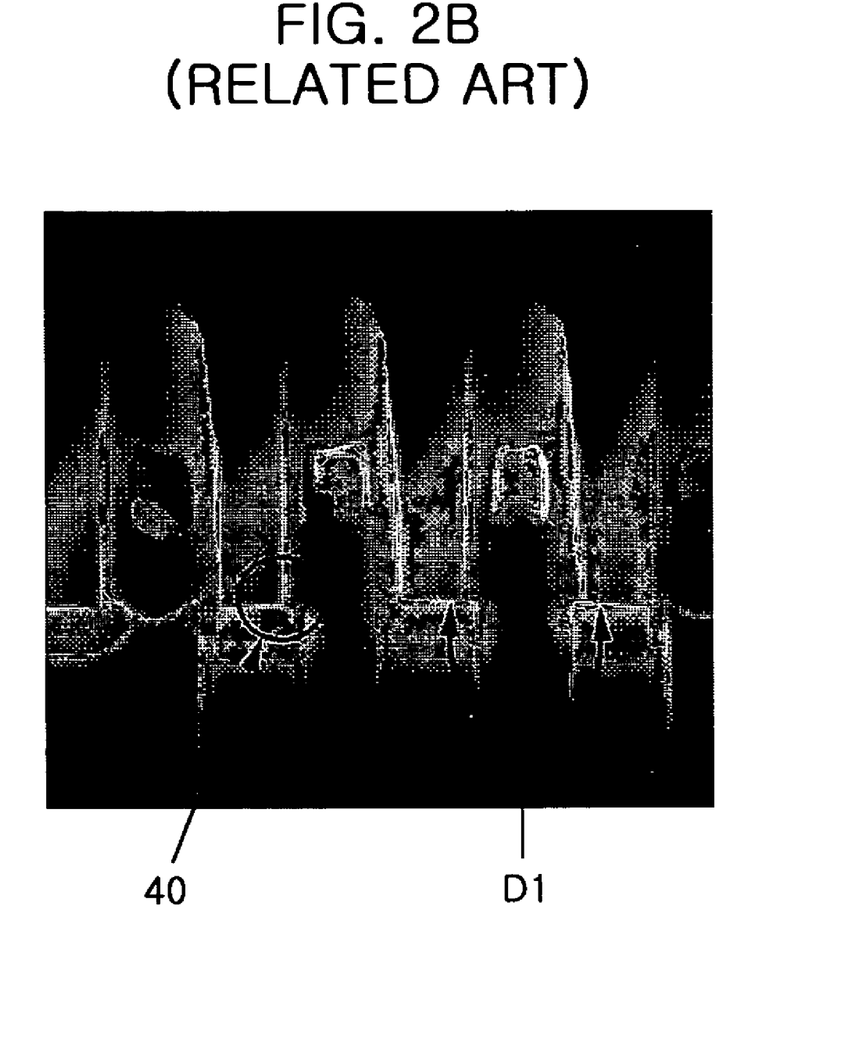

FIGS. 2A and 2B illustrate micrographic views of semiconductor devices fabricated by the typical method. Referring to FIG. 2A, a horn H is formed on an end of an active region adjacent to a device isolation region. Referring to FIG. 2B, the semiconductor device has a U-shaped recess profile having a channel length D1. A stress point is generated on a top corner 40 of a recess.

The semiconductor device fabricated by the above typical method has a longer channel length and an improved refresh characteristic in comparison with a typical planar gate. However, as semiconductor devices are being scaled down, it is generally necessary to lengthen the channel because the pattern is becoming more micronized and a space between devices is becoming narrower.

Furthermore, the horn H is generated on an edge of the active region adjacent to the device isolation region after the recesses are formed, often causing electric charges to concentrate around the horn H. Thus, a leakage current may be generated.

SUMMARY OF THE INVENTION

It is, therefore, an object of the present invention to provide a method for fabricating a semiconductor device having a flask-shaped recess gate, which can reduce a generation of a horn and increase a channel length.

In accordance with an aspect of the present invention, there is provided a method for fabricating a semiconductor device, including: forming a hard mask pattern on a substrate; etching the substrate using the hard mask pattern as an etch barrier to form a recess pattern; forming a passivation layer protecting surfaces of the recess pattern; etching a bottom surface of the recess pattern while protecting sidewalls of the recess pattern; performing an isotropic etching process onto a bottom portion of the recess pattern; and forming a gate pattern partially buried into the recess pattern after the isotropic etching process is performed.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A method for fabricating a semiconductor device having a recess gate in accordance with exemplary embodiments of the present invention will be described in detail with reference to the accompanying drawings.

FIGS. 3A to 3G are cross-sectional views illustrating a method for fabricating a semiconductor device in accordance with a specific embodiment of the present invention.

Figure 3A:
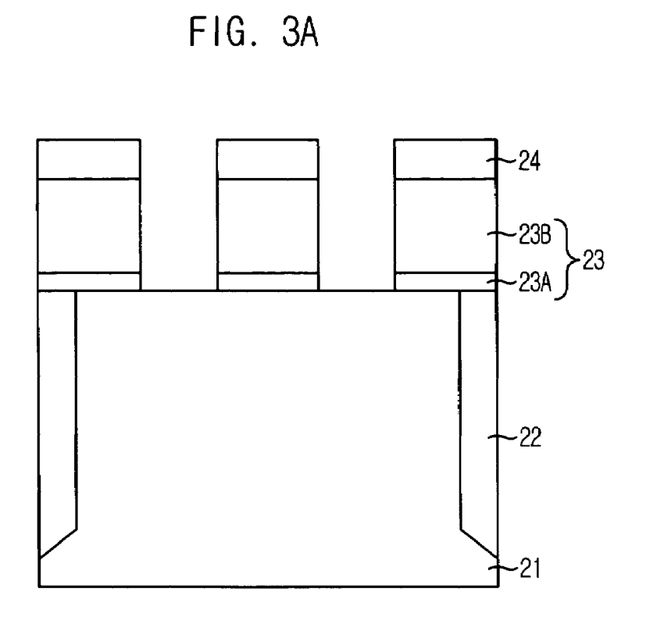
FIGS. 3A to 3G are cross-sectional views illustrating a method for fabricating a semiconductor device in accordance with a specific embodiment of the present invention.

Referring to FIG. 3A, a shallow trench isolation (STI) process is performed to form device isolation regions 22 in a substrate 21. The device isolation regions 22 defining an active region are formed to a predetermined depth of approximately 3,000 Å or deeper.

Predetermined regions of the substrate 21 are etched to form trenches to form the device isolation regions 22. An insulation layer is filled into the trenches and a chemical mechanical polishing (CMP) process is performed to form the device isolation regions 22.

A mask pattern 23 configured with a hard mask pattern 23B and a sacrificial oxide pattern 23A is formed over the substrate 21 and the device isolation regions 22, and a photoresist pattern 24 is formed over the mask pattern 23. In more detail, a sacrificial oxide layer is formed over the device isolation regions 22 and the substrate 21. The sacrificial oxide layer may be a pad oxide layer which has been used in the process of forming the device isolation regions 22. A hard mask layer is formed over the sacrificial oxide layer. The hard mask layer is formed to secure a margin of the photoresist pattern 24 during a subsequent process of etching the substrate 21. The hard mask layer includes a conductive layer containing silicon. Herein, polysilicon is used.

A photoresist layer is formed over the hard mask layer. The photoresist layer is patterned into a predetermined shape through exposure and development processes to thereby form the photoresist pattern 24. Then, the hard mask layer and the sacrificial oxide layer are etched using the photoresist pattern 24 as an etch mask, thereby forming the mask pattern 23 configured with the hard mask pattern 23B and the sacrificial oxide pattern 23A. The mask pattern 23 is used as an etch mask in a subsequent recess process.

Figure 3B:
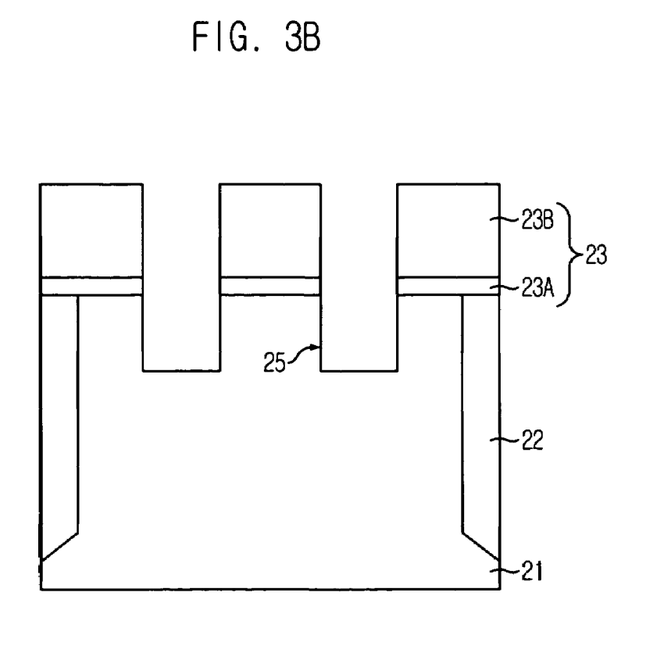

Referring to FIG. 3B, the photoresist pattern 24 is removed using oxygen plasma. Portions of the substrate 21 are etched using the mask pattern 23 as an etch mask to form a recess pattern 25. A plasma including hydrogen bromide (HBr) gas and chlorine ($Cl_2$) gas is used to etch the portions of the substrate 21 to form the recess pattern 25. The recess pattern 25 has a depth ranging from approximately 400 Å to approximately 500 Å, and has a vertical etch profile.

Figure 3C:
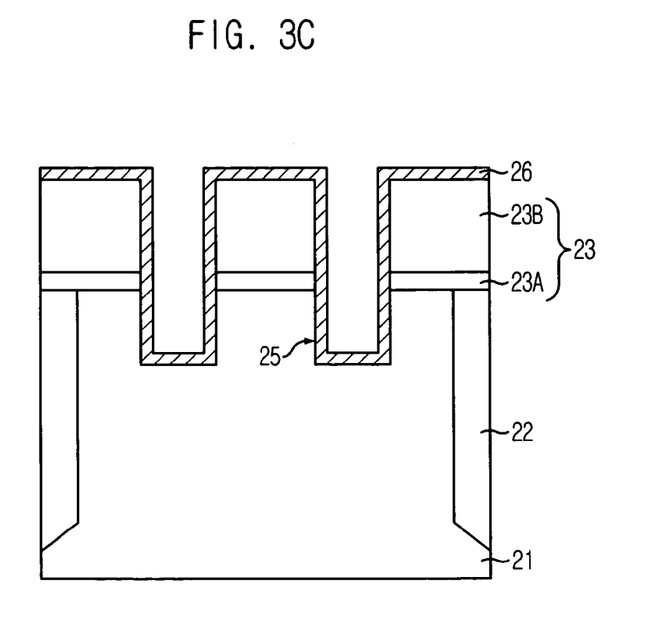

Referring to FIG. 3C, an oxide layer 26 is formed over the mask pattern 23 and the recess pattern 25. The oxide layer 26 is formed by oxidizing surfaces of the recess pattern 25 and the mask pattern 23. The oxide layer 26 functions as a passivation layer in a subsequent process for etching bottom portions of the recess pattern 25. A thermal oxidation process is performed to form the oxide layer 26.

The thermal oxidation process includes forming the oxide layer 26 in a furnace at a temperature ranging from approximately 800° C. to approximately 900° C. in ambient oxygen ($O_2$) The oxide layer 26 is formed to a thickness ranging from approximately 40 Å to approximately 80 Å. During the thermal oxidation process, the recess pattern 25 is oxidized because the substrate 21 includes silicon, and the mask pattern 23 is oxidized to form silicon dioxide ($SiO_2$) because the hard mask pattern 23B includes polysilicon. Thus, the oxide layer 26 is formed over sidewalls of the recess pattern 25, portions of the substrate 21 at the bottom of the recess pattern 25, and the mask pattern 23.

Figure 3D:
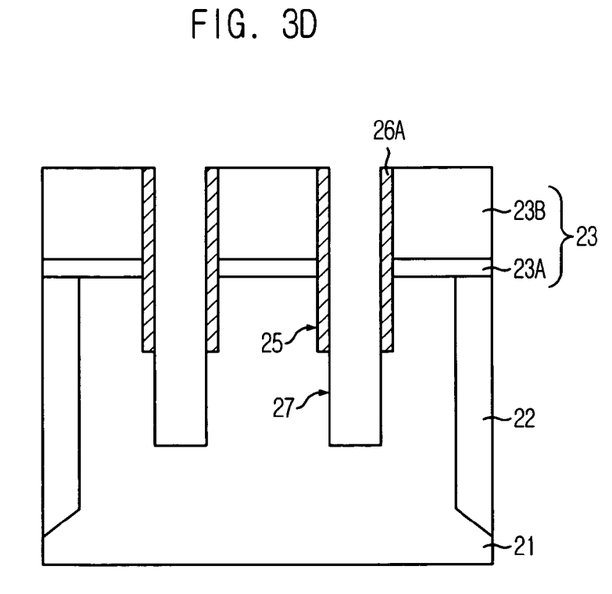

Referring to FIG. 3D, portions of the substrate 21 below the recess pattern 25 are etched to form bottom portions 27, using the oxide layer 26 and the mask pattern 23 as an etch mask. When the bottom portions 27 are formed, portions of the hard mask pattern 23B may be removed, and the oxide layer 26 only remains on the sidewalls of the mask pattern 23 and the recess pattern 25 to form a patterned oxide layer 26A. The bottom portions 27 are part of the recess pattern 25, and the patterned oxide layer 26A protects the sidewalls of the recess pattern 25.

A plasma including hydrogen bromide (HBr) and chlorine ($Cl_2$) is used during the etching for forming the bottom portions 27. The bottom portions 27 have a vertical etch profile. The bottom portions 27 may have a depth substantially the same as the recess pattern 25 or smaller. During the etching process for forming the bottom portions 27, the sidewalls of the recess pattern 25 are protected from being etched because of the patterned oxide layer 26A, but portions of the substrate 21 below bottom surfaces of the recess pattern 25 are etched away to a predetermined depth. Consequently, the patterned oxide layer 26A is not formed on sidewalls of the bottom portions 27, but is formed on the sidewalls of the recess pattern 25.

Figure 3E:
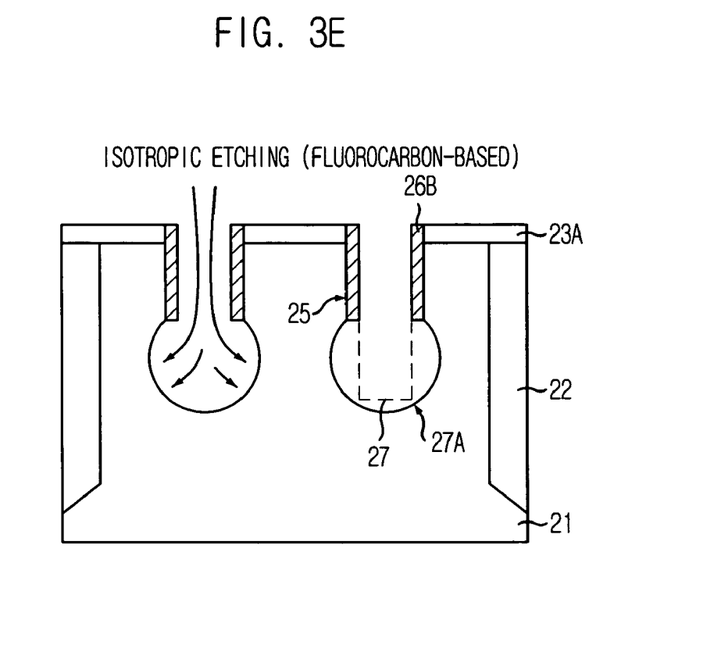

Referring to FIG. 3E, an isotropic etching process is performed to transform the bottom portions 27 into rounded bottom portions 27A in a round shape having a larger width than the recess pattern 25. Consequently, the bottom portions of the recess pattern 25 become the rounded bottom portions 27A. Thus, the recess pattern 25 including the rounded bottom portions 27A obtains a flask shape. The isotropic etching process is performed at a dry etch apparatus attached with a microwave generator (not shown), using a fluorocarbon-based gas. The fluorocarbon-based gas includes carbon tetrafluoride ($CF_4$) and the $CF_4$ gas flows at a rate ranging from approximately 100 sccm to approximately 200 sccm. The $CF_4$ gas has an isotropic etch characteristic unlike HBr gas and $Cl_2$ gas. Thus, the bottom portions 27 are etched into a round shape.

Since the microwave generator holds ions having straightness among ions of a plasma, the ions having straightness cannot reach the bottom portions 27 at the bottom. Thus, only radicals which perform a chemical etching are allowed to etch the bottom portions 27, rounding and widening the surface area. For instance, a plasma using the $CF_4$ gas includes electron, $CF_4$, $CF_{x(x=1-3)}$, fluoride (F), and $CF_3^\pm$, and only radicals having a very strong reactivity (i.e., $CF_3$ or F) can etch the bottom portions 27.

When the bottom portions 27 transform into the rounded bottom portions 27A, the hard mask pattern 23B is removed, and portions of the patterned oxide layer 26A formed on the sidewalls of the recess pattern 25 and the sacrificial oxide pattern 23A remain. Thus, remaining oxide layers 26B are formed.

The recess pattern 25 having the rounded bottom portions 27A forms a flask-shaped recess having a longer channel length than a typical U-shaped recess structure. Furthermore, it is possible to reduce a generation of a horn on ends of the active region adjacent to the device isolation regions 22 because the rounded bottom portions 27A have a round shape with a larger width than the recess pattern 25.

Figure 3F:
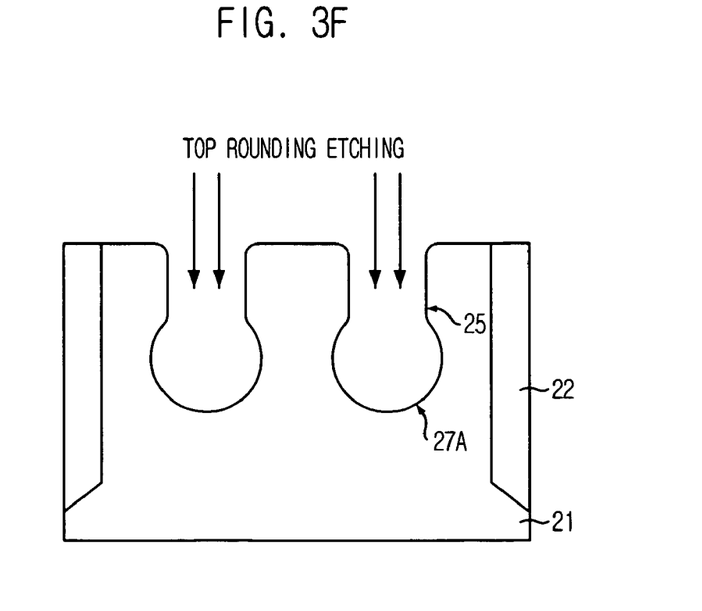

Referring to FIG. 3F, a cleaning process is performed to remove residues from the etching process, the sacrificial oxide pattern 23A, and the remaining oxide layers 26B. A rounding process is performed to round top corners of the recess pattern 25. A light etch treatment (LET) process is performed using a gas including $CF_4$ and $O_2$. The LET process generally etches damaged layers. As a result, a stress point of a leakage current is removed as the top corners of the recess pattern 25 are rounded, improving a refresh characteristic.

Figure 3G:
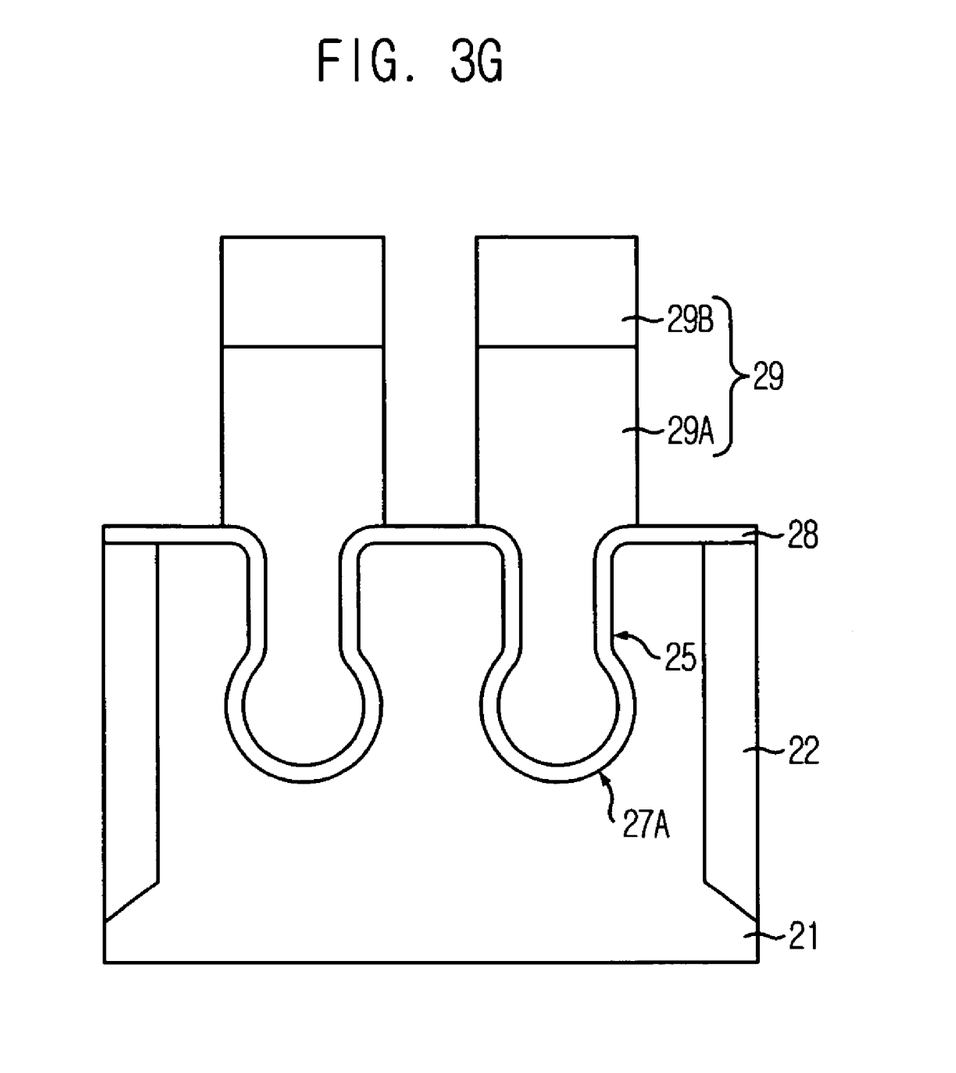

As shown in FIG. 3G, a gate insulation layer 28 is formed over the recess pattern 25 having the rounded bottom portions 27A, the device isolation regions 22, and the substrate 21.

Gate patterns 29 are formed on the gate insulation layer 28 such that a portion of each gate pattern 29 is buried into the recess pattern 25 having the rounded bottom portions 27A, and the other portion protrudes above the substrate 21. The gate patterns 29 have a stacked structure including a gate electrode 29A and a gate hard mask 29B formed in sequential order. The gate electrode 29A is formed in a stacked structure including polysilicon and tungsten silicide (WSix), and the gate hard mask 29B includes silicon nitride ($Si_3N_4$).

Figure 4:
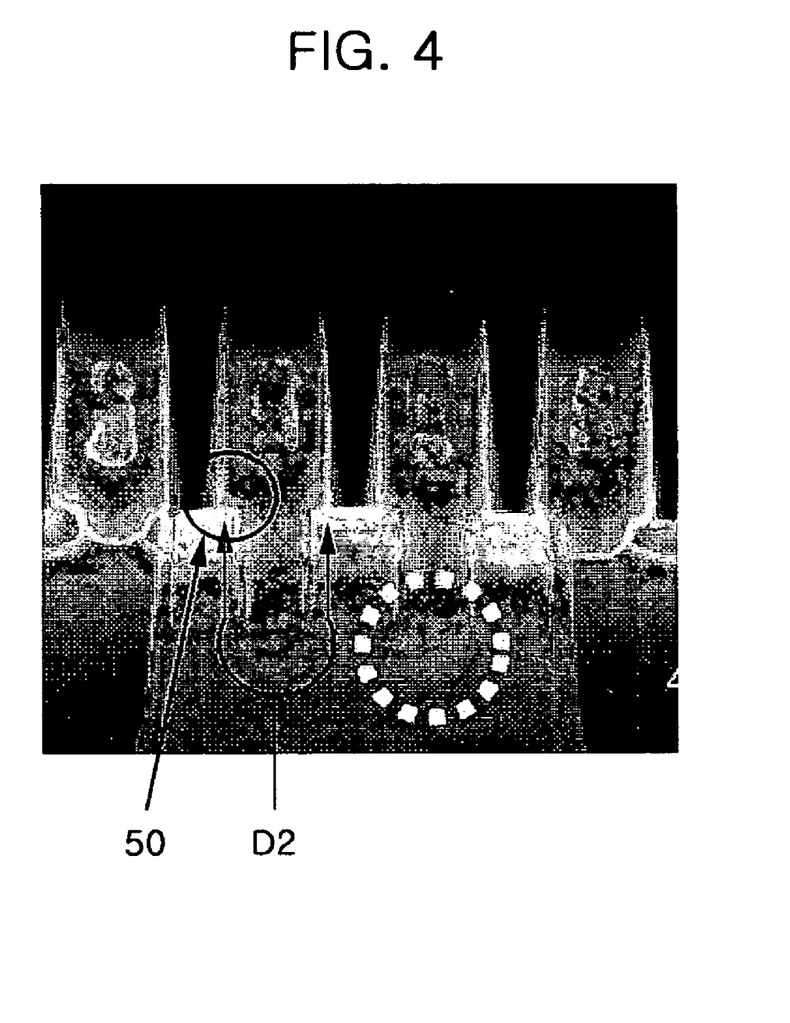
FIG. 4 illustrates a micrographic view of a recess profile of a semiconductor device fabricated in accordance with a specific embodiment of the present invention.

FIG. 4 is a micrographic view illustrating a recess profile of a semiconductor device fabricated in accordance with a specific embodiment of the present invention. The semiconductor device consistent with the specific embodiment of the present invention has a flask-shaped recess profile having a channel length D2, and a top corner 50 of the recess is rounded. In more detail, the channel length D2 is longer than the channel length D1 of the typical semiconductor having the U-shaped recess profile (see FIG. 2B) because the channel length of the semiconductor device consistent with the specific embodiment of the present invention is lengthened in virtue of the flask-shaped recess.

Accordingly, the present invention provides benefits such as reducing the generation of the horns and increasing the channel length by forming the flask-shaped recess having the round profile. In addition, the rounding process is performed to remove the stress point at the top corners of the recess, reducing the leakage current.

In accordance with the specific embodiment of the present invention, the method for fabricating the semiconductor device having the flask-shaped recess gate increases a threshold voltage by increasing the channel length. Accordingly, a breakdown voltage characteristic is enhanced and the refresh characteristic is also improved in virtue of the rounding process.

The present application contains subject matter related to the Korean patent application No. KR 2005-103734, filed in the Korean Patent Office on Nov. 1, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming a hard mask pattern on a substrate;
    etching the substrate using the hard mask pattern as an etch barrier to form a first recess;
    forming a spacer layer over the resultant substrate structure after etching the substrate;
    etching the substrate below the first recess using the spacer layer and the hard mask pattern as an etch barrier to form a second recess;
    performing an isotropic etching process to transform the second recess into a round shape having a larger width than the first recess;
    removing the spacer layer after performing the isotropic etching process; and
    forming a gate pattern partially buried into the first and second recess after the isotropic etching process is performed.

2. The method of claim 1, wherein the hard mask pattern comprises a conductive layer containing silicon.

3. The method of claim 2, wherein the hard mask pattern includes a stacked structure of oxide and polysilicon.

4. The method of claim 1, wherein the forming of the spacer layer comprises oxidizing surfaces of the first recess and the hard mask pattern.

5. The method of claim 4, wherein the oxidizing surfaces of the first recess and the hard mask pattern comprises flowing oxygen ($O_2$).

6. The method of claim 5, wherein the flowing of $O_2$ comprises flowing $O_2$ in a furnace.

7. The method of claim 6, wherein the furnace is maintained at a temperature ranging from approximately 800° C. to approximately 900° C.

8. The method of claim 4, wherein the spacer layer is formed to a thickness ranging from approximately 40 Å to approximately 80 Å.

9. The method of claim 1, wherein the forming of the first recess comprises using a plasma including hydrogen bromide (HBr) and chlorine ($Cl_2$).

10. The method of claim 9, wherein the first recess is formed to a depth ranging from approximately 400 Å to approximately 500 Å.

11. The method of claim 1, wherein the etching of the substrate below the first recess comprises using a plasma including HBr and $Cl_2$.

12. The method of claim 1, wherein the performing of the isotropic etching process to transform the second recess comprises performing the isotropic etching process at a dry etch apparatus attached with a microwave generator.

13. The method of claim 12, wherein the isotropic etching process is performed under a condition that allows a selective etching of the second recess at the dry etch apparatus attached with the microwave generator.

14. The method of claim 13, wherein the condition comprises using a fluorocarbon-based gas.

15. The method of claim 14, wherein the fluorocarbon-based gas includes carbon tetrafluoride ($CF_4$) gas.

16. The method of claim 15, wherein the $CF_4$ gas flows at a rate ranging from approximately 100 sccm to approximately 200 sccm.

17. The method of claim 1, further comprising, after the performing of the isotropic etching process to transform the second recess:
    removing the spacer layer and the hard mask pattern; and
    rounding top corners of the first and second recess to form a flask-shaped recess pattern.

18. The method of claim 17, wherein the rounding of the top corners comprises using a gas including $CF_4$ and $O_2$.

* * * * *